United States Patent
McCord et al.

(10) Patent No.: US 9,366,524 B2
(45) Date of Patent: Jun. 14, 2016

(54) ALIGNMENT SENSOR AND HEIGHT SENSOR

(71) Applicant: KLA-Tencor Corporation, Milpitas, CA (US)

(72) Inventors: Mark A. McCord, Los Gatos, CA (US); Joseph DiRegolo, Livermore, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 14/481,076

(22) Filed: Sep. 9, 2014

(65) Prior Publication Data

US 2015/0097126 A1    Apr. 9, 2015

Related U.S. Application Data

(60) Provisional application No. 61/888,385, filed on Oct. 8, 2013.

(51) Int. Cl.
*G01B 11/14* (2006.01)
*G01B 11/06* (2006.01)
*G01B 11/27* (2006.01)
*G03F 9/00* (2006.01)

(52) U.S. Cl.
CPC ............ *G01B 11/0608* (2013.01); *G01B 11/27* (2013.01); *G03F 9/7007* (2013.01); *G03F 9/7034* (2013.01); *G03F 9/7069* (2013.01); *H01J 2237/2482* (2013.01); *H01J 2237/30438* (2013.01); *H01J 2237/31774* (2013.01)

(58) Field of Classification Search
USPC .................................. 356/614–624, 399–401
See application file for complete search history.

(56) References Cited

U.S. PATENT DOCUMENTS

| | | | |
|---|---|---|---|
| 5,184,196 A * | 2/1993 | Nakagawa et al. | 356/401 |
| 5,576,831 A | 11/1996 | Nikoonahad et al. | |
| 5,726,757 A * | 3/1998 | Kato | G03F 7/70275 356/388 |
| 6,071,656 A | 6/2000 | Lin | |
| 6,081,325 A | 6/2000 | Leslie et al. | |
| 6,628,390 B1 | 9/2003 | Johnson | |
| 6,897,956 B2 * | 5/2005 | Noguchi et al. | 356/401 |
| 6,943,429 B1 | 9/2005 | Glenn et al. | |

OTHER PUBLICATIONS

PCT International Search Report for Application No. PCT/US2014/055242, Jul. 17, 2015, 4 sheets.

* cited by examiner

*Primary Examiner* — Tri T Ton
(74) *Attorney, Agent, or Firm* — Okamoto & Benedicto LLP (57) ABSTRACT

One embodiment relates to a device that senses alignment and height of a work piece. The device may include both an alignment sensor and a height sensor. The alignment sensor generates a first illumination beam that illuminates an alignment mark on the work piece so as to create a first reflected beam, and determines the alignment of the work piece using the first reflected beam. The height sensor generates a second illumination beam that is directed to a surface of the work piece at an oblique angle so as to form a second illumination spot and images the second illumination spot to determine the height of the work piece. Other embodiments, aspects and features are also disclosed.

12 Claims, 7 Drawing Sheets

ALIGNMENT SENSOR AND HEIGHT SENSOR

CROSS-REFERENCE TO RELATED APPLICATION(S)

The present application claims the benefit of provisional U.S. Patent Application No. 61/888,385, filed Oct. 8, 2013 by inventors Mark McCord and Joe Di Regolo, the disclosure of which is hereby incorporated by reference.

GOVERNMENT LICENSE RIGHTS

This invention was made with Government support under Agreement No. HR0011-07-9-007 awarded by DARPA. The Government has certain rights in the invention.

BACKGROUND OF THE INVENTION

1. Technical Field

The present disclosure relates to apparatus and methods for alignment and height sensing.

2. Description of the Background Art

A conventional lithographic process includes the patterned exposure of a resist allowing portions of the resist to be selectively removed, thereby exposing underlying areas for selective processing, such as etching, material deposition, ion implantation and the like. Typically, lithographic processes utilize ultraviolet light for selective exposure of the resist.

In addition, charged particle beams (e.g., electron beams) have been used for high resolution lithographic resist exposure. The use of e-beam based lithography systems allows for relatively accurate control of the electron beam at relatively low power and relatively high speed. Electron beam lithographic systems may include electron-beam direct write (EBDW) lithography systems and electron beam projection lithography systems.

SUMMARY

One embodiment relates to a device that senses alignment and height of a work piece. The device may include both an alignment sensor and a height sensor. The alignment sensor generates a first illumination beam that illuminates an alignment mark on the work piece so as to create a first reflected beam, and determines the alignment of the work piece using the first reflected beam. The height sensor generates a second illumination beam that is directed to a surface of the work piece at an oblique angle so as to create a second reflected beam and detects the second reflected beam to determine the height of the work piece.

Another embodiment relates to a method of determining an alignment and height of a work piece. A first illumination beam is generated. The first illumination beam is shaped to form a first illumination spot on the work piece. The first illumination spot may advantageously have a shape comprising a long axis of illumination that is parallel to a long dimension of a rectangular alignment mark on the work piece and a short axis of illumination that is parallel to a short dimension of the rectangular alignment mark. A first reflected beam is obtained from the first illumination spot, and the first reflected beam is used to determine the alignment. A second illumination beam is generated and directed to a surface of the work piece at an oblique angle such that a second illumination spot is formed on the surface of the work piece. The second illumination spot is imaged so as to determine a height of the surface.

Another embodiment relates to an apparatus for electron-beam lithography. The apparatus includes a plurality of electron-beam lithography columns spaced at a pitch in at least one dimension. The apparatus further includes a plurality of alignment sensors for determining an alignment of the plurality of electron-beam lithography columns. Each alignment sensor of the plurality of alignment sensors generates a first illumination beam that illuminates an alignment mark on a wafer so as to create a first reflected beam, and determines the alignment of the wafer using the first reflected beam. The apparatus further includes a plurality of stages that are movable in the one dimension on which the plurality of sensors are mounted, wherein the plurality of stages are spaced at the pitch in the one dimension.

Another embodiment relates to an alignment sensor. An illumination system generates a shaped illumination beam and focuses the shaped illumination beam to form an illumination spot on an alignment mark on the work piece, wherein the illumination spot has a shape comprising a long axis of illumination that is parallel to the long dimension of a rectangle of the alignment mark and a short axis of illumination that is parallel to the short dimension of the rectangle of the alignment mark. A detection system detects a reflected beam from the illumination spot to determine an alignment of the work piece.

Another embodiment relates to a method of sensing a height of a work piece. An illumination beam is generated and directed to a surface of the work piece at an oblique angle such that an illumination spot is formed on the surface of the work piece. A reflected beam from the illumination spot is detected so as to obtain an imaged spot. A derivative signal of the imaged spot is generated, and a threshold is applied to the derivative signal to construct a spot outline. A center location of the spot outline is determined, and the center location is used to determine the height of the work piece.

Other embodiments, aspects and features are also disclosed.

DETAILED DESCRIPTION

Accurate and precise alignment of a work piece is often highly desirable or necessary in manufacturing and other processes. In an exemplary application, the work piece may be a semiconductor wafer on which integrated circuits are being manufactured. In this context, the alignment sensor may be an optical sensor that may use imaging, diffraction or optical interference to determine the relative position of a mark on the wafer.

Figure 1A:
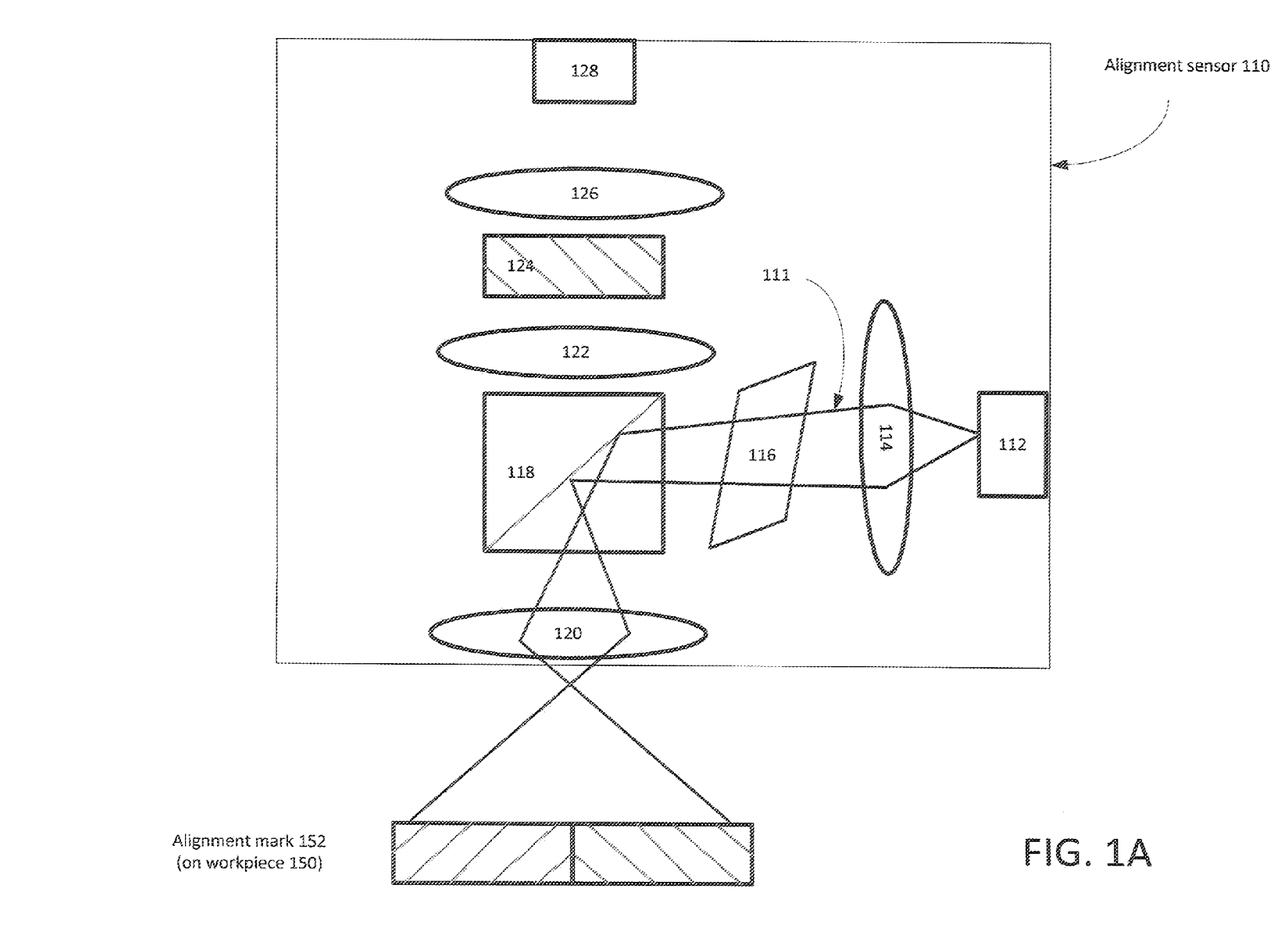
FIG. 1A is an optical ray diagram showing an illumination beam of an alignment sensor in accordance with an embodiment of the invention.

FIG. 1A is an optical ray diagram showing an illumination beam of an alignment sensor 110 that forms an illumination spot on an alignment mark 152 on a work piece 150 in accordance with an embodiment of the invention. As shown, the illumination path of the alignment sensor 110 may include an illumination source 112, illumination lens (or lenses) 114, an illumination aperture 116, a beamsplitter 118, and an objective lens 120.

An illumination beam 111 may be generated using the illumination source 112, the illumination lens (or lenses) 114, and the illumination aperture 116. The illumination beam 111 may be reflected or partially reflected by the beam splitter 118 towards the objective lens 120. The objective lens 120 focuses the illumination beam 111 to form a beam spot image on the surface of the work piece 150.

In an exemplary implementation, the alignment mark 152 may be rectangular in outline shape with a smaller dimension limited to less than the width of the scribe line between dies on a semiconductor wafer being manufactured. Alignment marks 152 may be on both horizontal and vertical scribe lines. For an alignment mark on a horizontal scribe line, the smaller dimension of the rectangular outline of mark 152 is in the vertical dimension. For an alignment mark on a vertical scribe line, the smaller dimension of the rectangular outline of the 152 is in the horizontal dimension.

The illumination generated by the source 112 may be white light, monochromatic light from a laser or diode, or a multi-spectral illumination. While conventional alignment sensors use a circularly symmetric illumination spot, the presently-disclosed alignment sensor may use an elliptical or rectangular illumination spot so as to provide an improved signal-to-noise ratio in accordance with an embodiment of the invention. The smaller dimension of the ellipse or rectangle is in the same dimension as the smaller dimension of the rectangular outline of the alignment mark 152. Such an elliptical or rectangular illumination spot may be used to maximize illumination on the mark (so as to maximize signal strength) while minimizing illumination outside the mark (which would contribute to noise).

In one embodiment, the elliptical or rectangular illumination spot may be generated using a cylindrical lens in the illumination optics 114. In another embodiment, the elliptical or rectangular illumination spot may be generated using a shaped illumination aperture 116 at an image plane. In another embodiment, the elliptical or rectangular illumination spot may be generated using an illumination source 112 that is shaped.

When alignment marks 152 are implemented on both horizontal and vertical scribe lines between integrated circuit dies, a mechanism for rotating the spot axis by ninety degrees may be employed. For example, if a cylindrical lens in the illumination optics 114 is used to generate the elliptical or rectangular illumination spot, then the cylindrical lens may be rotated by ninety degrees. If a shaped illumination aperture 116 is used to generate the elliptical or rectangular illumination spot, then the shaped illumination aperture 116 may be rotated by ninety degrees. If a shaped illumination source 112 is used to generate the elliptical or rectangular illumination spot, then the shaped illumination source 112 may be rotated by ninety degrees. Alternatively, instead of rotating the spot axis by ninety degrees, a fixed illumination spot with a cross pattern or an L-shaped pattern may be used. Another embodiment, instead of rotating the spot axis, may have two shaped lenses, apertures or light sources at two orientations, that are swapped electrically (light sources) or mechanically (lenses, apertures or light sources).

Figure 1B:
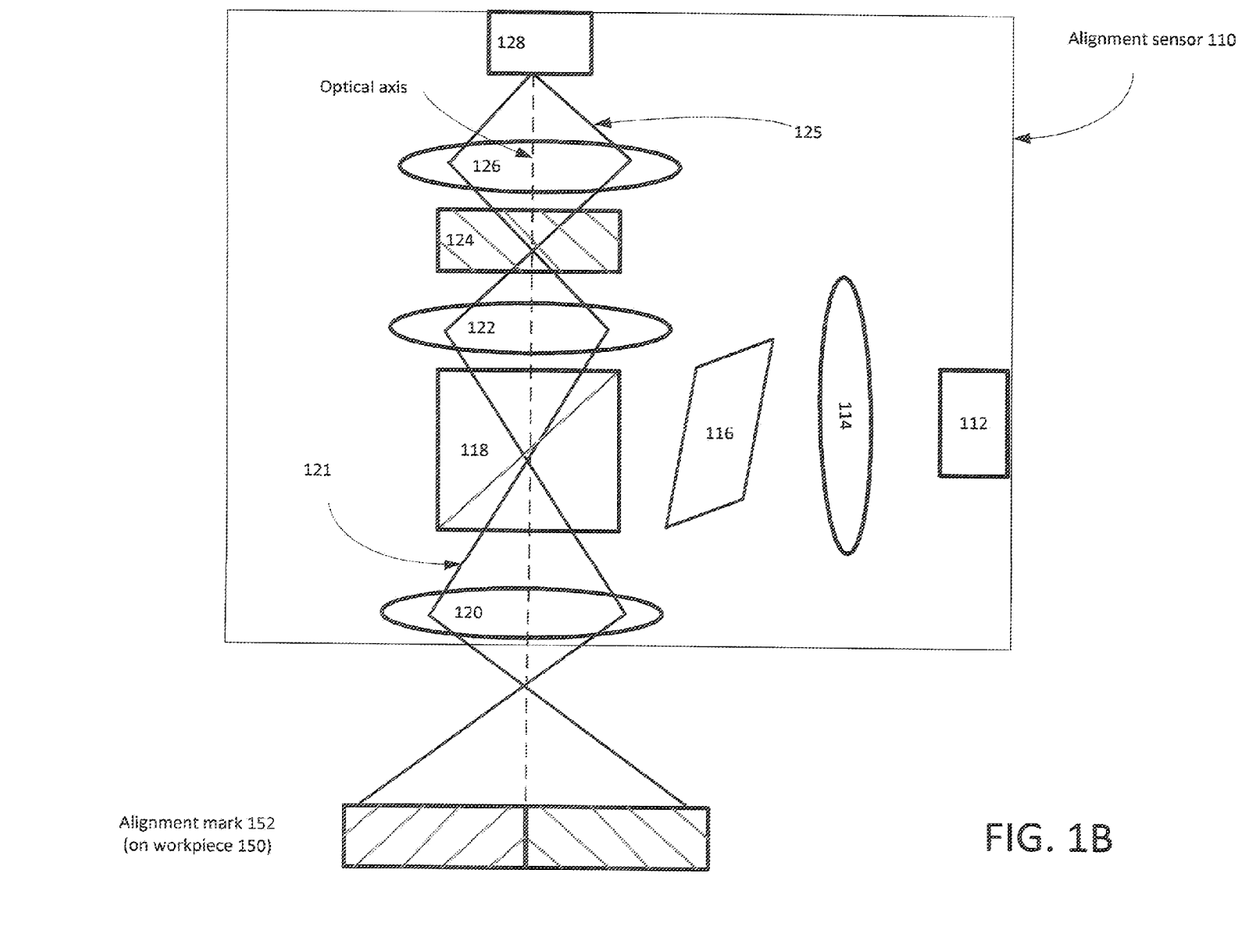
FIG. 1B is an optical ray diagram showing a reflected beam of the alignment sensor in accordance with an embodiment of the invention.

FIG. 1B is an optical ray diagram showing a reflected beam of the alignment sensor 110 in accordance with an embodiment of the invention. As depicted, the reflected beam 121 is formed from the light reflected or diffracted from the alignment mark 152 on the work piece 150.

The reflected beam 121 may be focused by the objective lens 120 and transmitted or partially transmitted through the beam splitter 118. A first focusing lens 122 focuses the reflected beam 121 transmitted through the beam splitter 118 onto a reference grating 124.

The reference grating 124 diffracts the light so as to form a diffracted beam 125. The diffracted beam 125 is focused by a second focusing lens 126 onto a detector 128. The alignment mark and reference grating is coordinated such that the signal from the detector 128 indicates alignment of the illumination beam relative to the alignment mark.

Figure 1C:
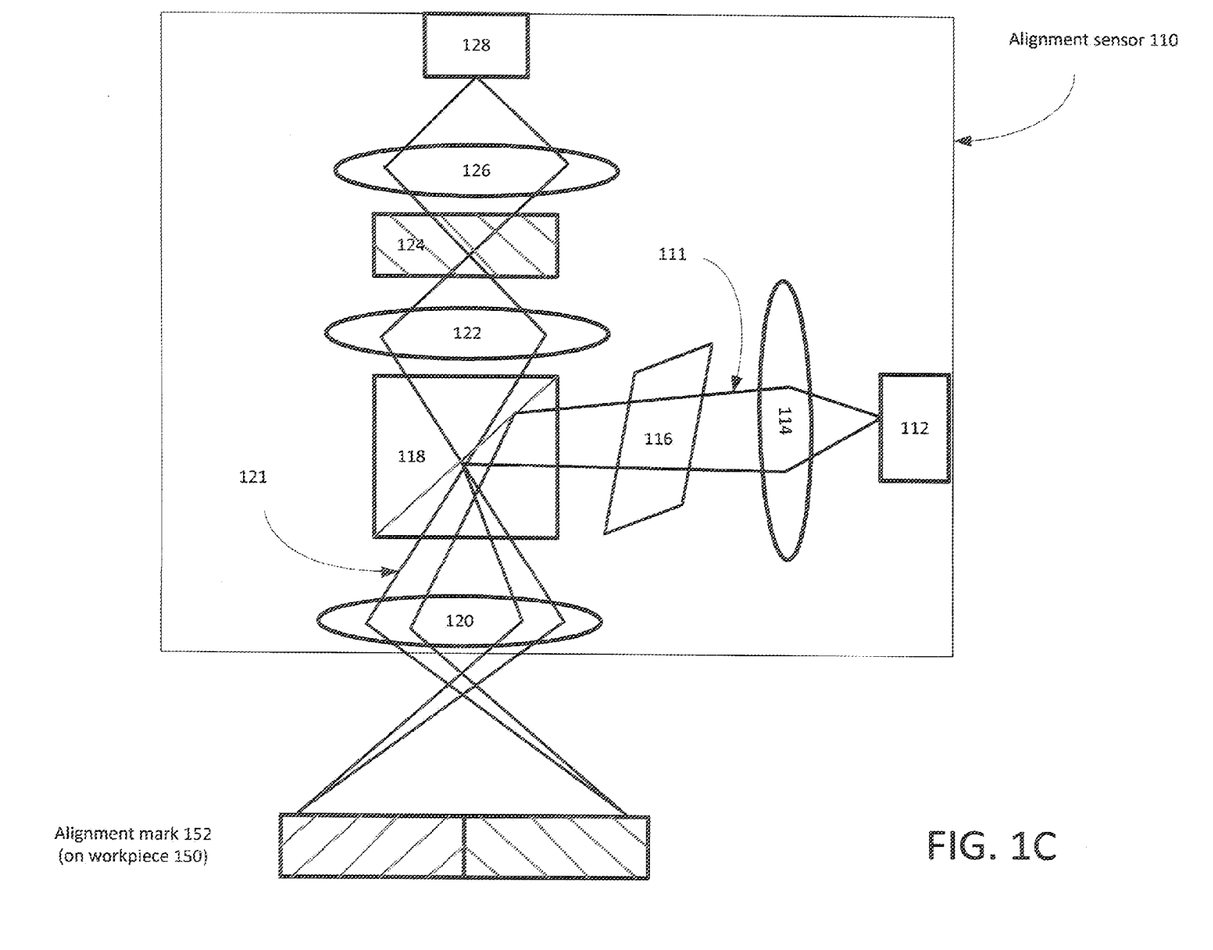
FIG. 1C is an optical ray diagram showing the illumination and reflected beams of the alignment sensor in accordance with an embodiment of the invention.

FIG. 1C is an optical ray diagram showing the illumination beam 111 and the reflected beam 121 of the alignment sensor 110 in accordance with an embodiment of the invention. As shown, the beam splitter 118 allows for the optical paths of both the illumination and reflected beams to pass through the objective lens 120.

In accordance with an embodiment of the invention, improved performance may be realized in at least three ways. First, the alignment sensor 110 may provide an illumination spot sufficient to illuminate the entire alignment mark 152 at once. This advantageously assists in averaging out errors from line edge roughness and random placement errors in mark fabrication. Second, the illumination spot may be scanned over the wafer in either horizontal or vertical directions. This allows for the reading of alignment marks placed in either horizontal or vertical scribe lines while the stage is moving in only one direction. Third, if local optical power density is a limitation, then performance of the alignment sensor 110 may be improved by increasing the optical power. This reduces shot noise effects and the relative impact of detector electronic noise.

In some applications, instead of being statically illuminated, the alignment mark 152 may be scanned by an illumination spot that moves relative to the work piece 150. The relative motion may be due to movement of the wafer stage relative to the alignment sensor 110.

For a round illumination spot, the alignment mark 152 should be scanned parallel to its long axis to maximize the signal collection time for best mark detection accuracy. However, for an illumination spot that is shaped asymmetrically (for example, as an ellipse, rectangle, cross shape, or L shape) to match the shape and size of the alignment mark 152, the mark may be scanned in either direction with equivalent or near equivalent accuracy.

In another embodiment, instead of the reflected beam 121 of the alignment mark 152 being diffracted through a reference grating as shown in FIGS. 1A-1C, the alignment mark 152 may be imaged on a two-dimensional detector (such as a 2D CCD array).

Figure 2:
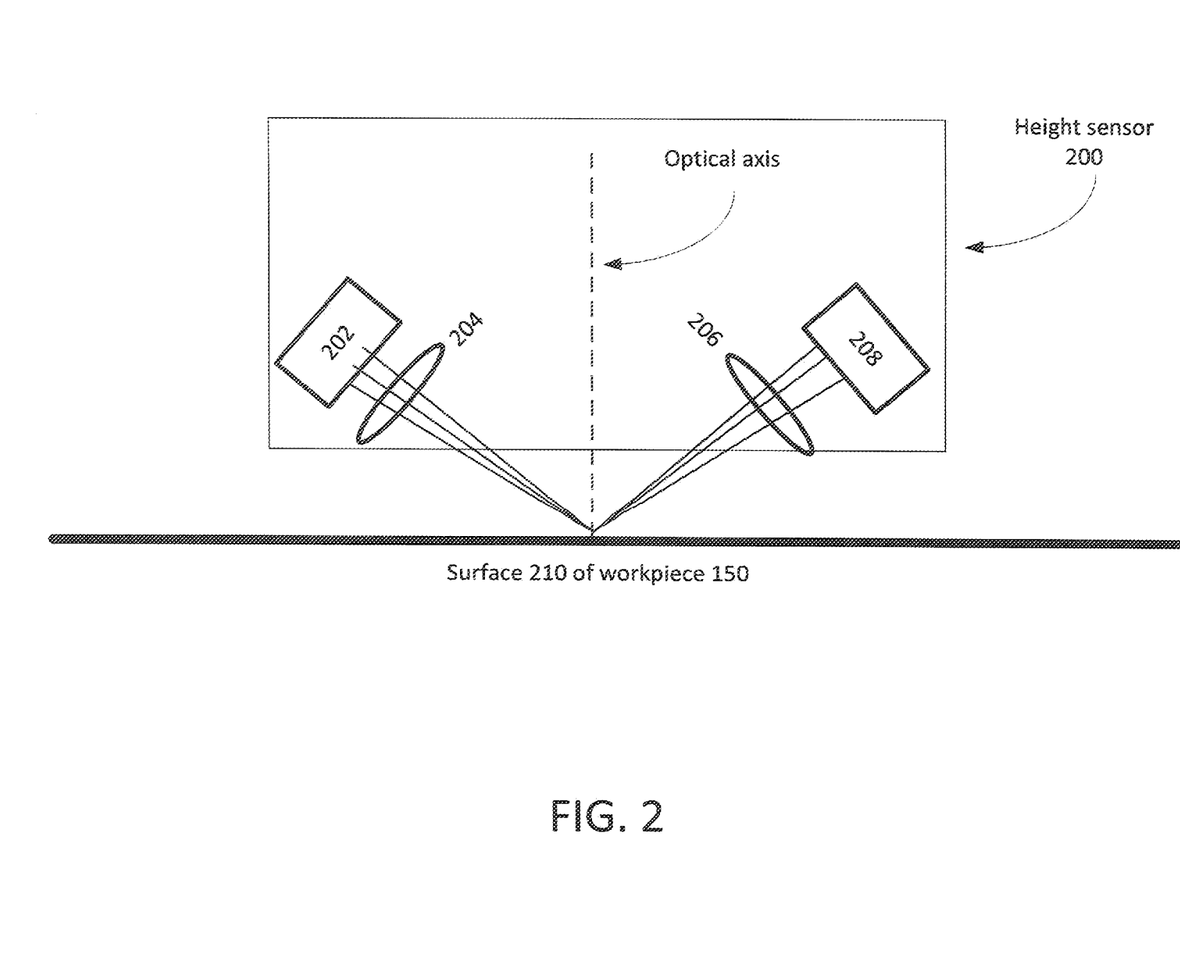
FIG. 2 is an optical ray diagram of a height sensor in accordance with an embodiment of the invention.

FIG. 2 is an optical ray diagram of a height sensor 200 in accordance with an embodiment of the invention. The height sensor 200 may be used to determine the distance of the work piece 150 relative to the height sensor 200 (in the vertical direction if the height sensor 200 is vertically above the work piece 150).

As depicted, the height sensor 200 may include an illumination source 202, an illumination lens 204, a detection lens 206, and a detector 208. The illumination source 202 generates an incident light beam that is focused by the illumination lens 204 onto a spot on the surface 210 of the work piece 150. The incident light beam may impinge on the surface 210 at a glancing or oblique (non-normal) incident angle and be reflected from the surface 210 at a corresponding reflection angle. The reflected light is focused by the detection lens 206 onto the detector 208.

In accordance with an embodiment of the invention, the detector 208 may be a two-dimensional (2D) detector that is position sensitive in the two dimensions. For example, the detector 208 may be a 2D charge-coupled device (CCD) imaging sensor. A windowing capability of the 2D detector may be utilized so as to provide a higher frame rate by ignoring detector pixels outside the window, where the window is set based on the known information about the location, size and shape of the spot 302.

In a conventional apparatus, such a 2D detector is prone to erroneous readings in the presence of pre-existing patterns formed on the wafer. This is due to the pre-existing patterns distorting the intensity and symmetry of the reflected beam. Errors due to either the variations in wafer reflectivity or diffraction effects caused by the pre-existing patterns cause an apparent shift in the wafer height reading.

The present disclosure provides a solution that provides an accurate wafer height reading, even in the presence of a pre-existing pattern on the wafer. As an example, consider the asymmetric spot image 302 shown on the left in FIG. 3 as may be formed on the surface 210 of the work piece 150 by the height sensor 200. As discussed above, the asymmetric spot image 302 may be due to a wafer pattern effect.

Figure 3:
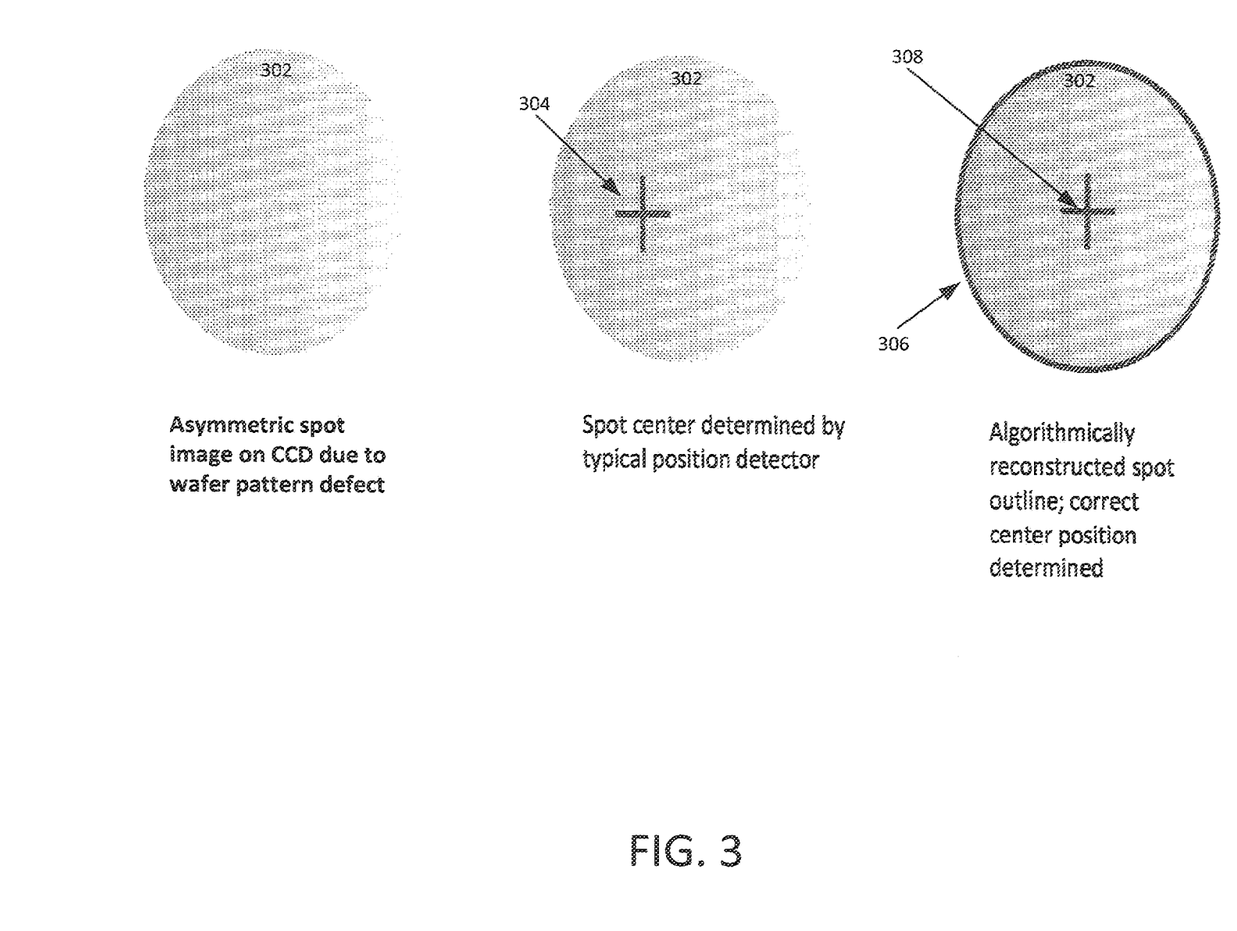
FIG. 3 depicts an asymmetric spot image, a conventionally-determined spot center, and a correctly-determined spot center in accordance with an embodiment of the invention.

A conventional determination of a spot center 304 of an asymmetric spot image 302 is shown in the middle in FIG. 3. The spot center 304 is offset from the correct center of the spot because the asymmetric intensity of the spot 302. In this case, since the intensities are higher on the left side of the spot 302, the spot center 304 is shifted to the left from the correct center.

One method for determining the correct center 308 of the spot 302 is illustrated on the right side of FIG. 3 in accordance with an embodiment of the invention. In this method, edge detection may be used to determine a spot outline 306. If the detector signal is analog, then the edge detection may involve applying a derivative-forming circuit to the detector signal so as to generate a derivative signal. If the detector signal is digital, then the edge detection may involve digitally generating the derivative signal. The derivative signal is indicative of "edges" that are potential locations of the spot outline 306. Other algorithms may also be used to estimate the true location of the spot (i.e. the location of the spot in the absence of the pattern noise). A threshold may be applied to the derivative signal so as to construct the spot outline 306. The knowledge of the true size and shape of the spot 302 may be utilized in constructing the spot outline 306. A correct center of the spot 302 may be determined by locating a center 308 of the spot outline 306.

The height of the work piece may then be determined from the location of the center 308. For example, the closer the center 308 is to the illumination lens 204, the higher is the height of the work piece. On the other hand, the closer the center 308 is to the detection lens 206, the lower is the height of the work piece.

In an alternate embodiment, a one-dimensional (1D) detector may be used for the detector 208, such as a 1D CCD or CMOS imaging sensor. While more accurate height sensing may be performed with a 2D detector, using a 1D detector advantageously provides a higher frame rate and uses less system bandwidth. For a 1D detector, derivative signal indicates edge points that are potential locations for the end points (extremities) of the spot 302, and the threshold application may be used to select the end points of the spot 302 (i.e. the "outline" of the spot in 1D) from the edge points. The correct center 308 of the spot 302 may then be determined to be at a middle point between the end points.

In another possible detector configuration, two apertures at the illumination image plane that are spaced along the motion axis of the sensor may be monitored by a detection system. The detection system may be implemented, for example, as two position-sensitive detectors, or two bi-cell detectors, or a CCD or CMOS imaging sensor. The spacing of the two apertures may be set to be sufficiently far apart to reduce any underlying pattern dependent diffraction from changing the energy spread across the spaced apertures. For example, an underlying pattern may be a patterned layer underlying a resist layer. Provided that the optical configuration of the height sensor 200 is telecentric, the spacing and magnification should remain constant as the wafer position changes or tilts.

A polarizing filter in the illumination arm and/or projection arm of the height sensor 200 may be provided to reduce the effects of underlying patterns (for example, patterned layers underlying a resist surface). The polarizing filter does this by increasing the reflectivity of the "S" polarization at the resist surface. In addition, the angle of incidence to the wafer may also be reduced to improve the reflectivity of the resist surface so as to reduce the effects of the underlying patterns.

Figure 4:
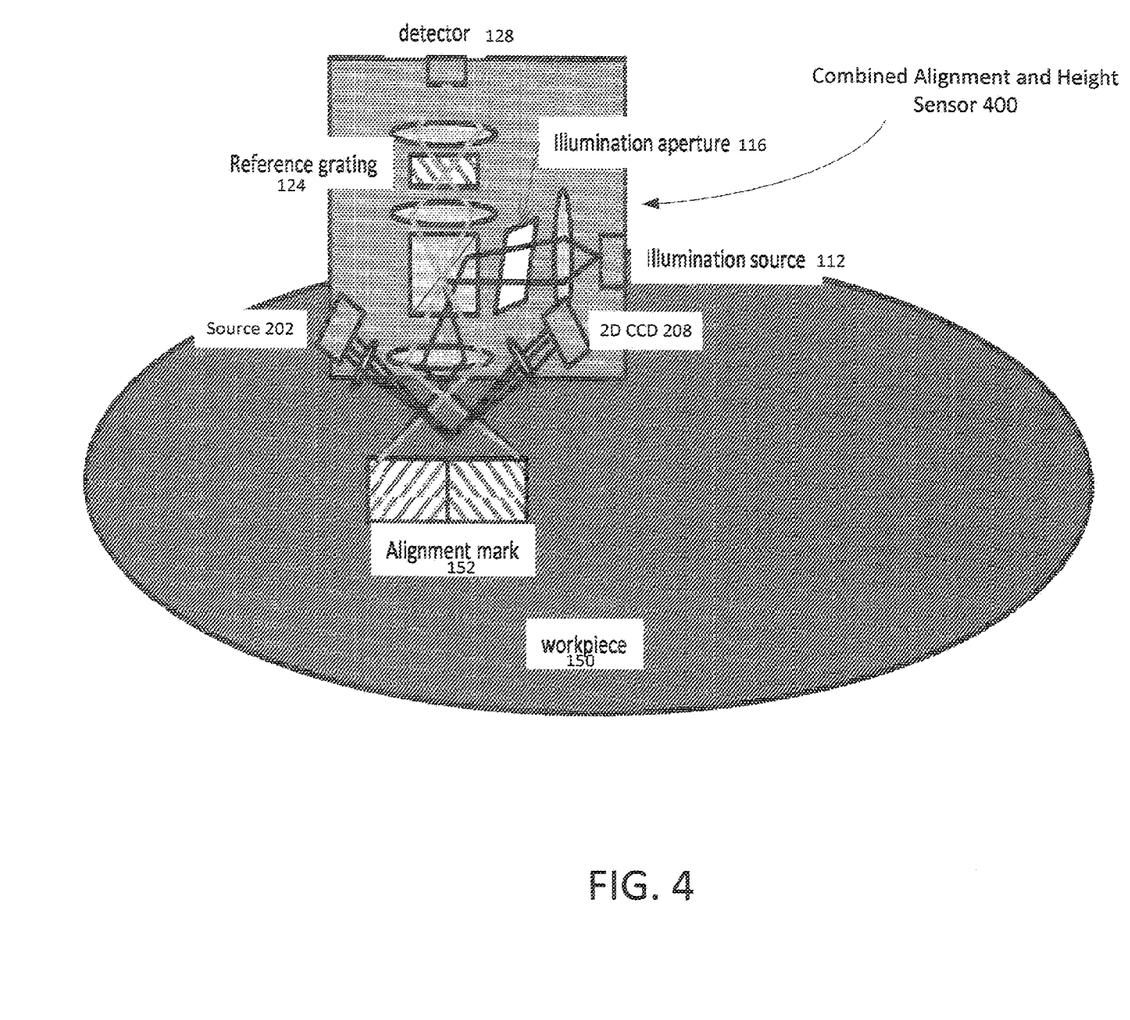
FIG. 4 depicts a combined alignment and height sensor in accordance with an embodiment of the invention.

FIG. 4 depicts a combined alignment and height sensor 400 in accordance with an embodiment of the invention. The combined sensor 400 may be operated to determine both alignment and height at a same time.

As shown, the combined sensor 400 includes components of both the alignment sensor 100 and the height sensor 200. In order to minimize space, cost, and maximum accuracy, the optics of the height sensor 200 and the optics of the alignment sensor 100 may share the same optical axis. The optical axis of the height sensor 200 is depicted in FIG. 2, and the optical axis of the alignment sensor is depicted in FIG. 1B. Optical components may or may not be shared, depending upon the optical and mechanical design.

In one embodiment of the combined alignment and height sensor 400, one or more filter may be added to the optics for the alignment sensor 100 and/or the height sensor 200. The filters may be advantageously used to prevent the light from the height sensor from degrading the alignment signal and also to prevent the light from the alignment sensor from degrading the height sensor reading.

Figure 5:
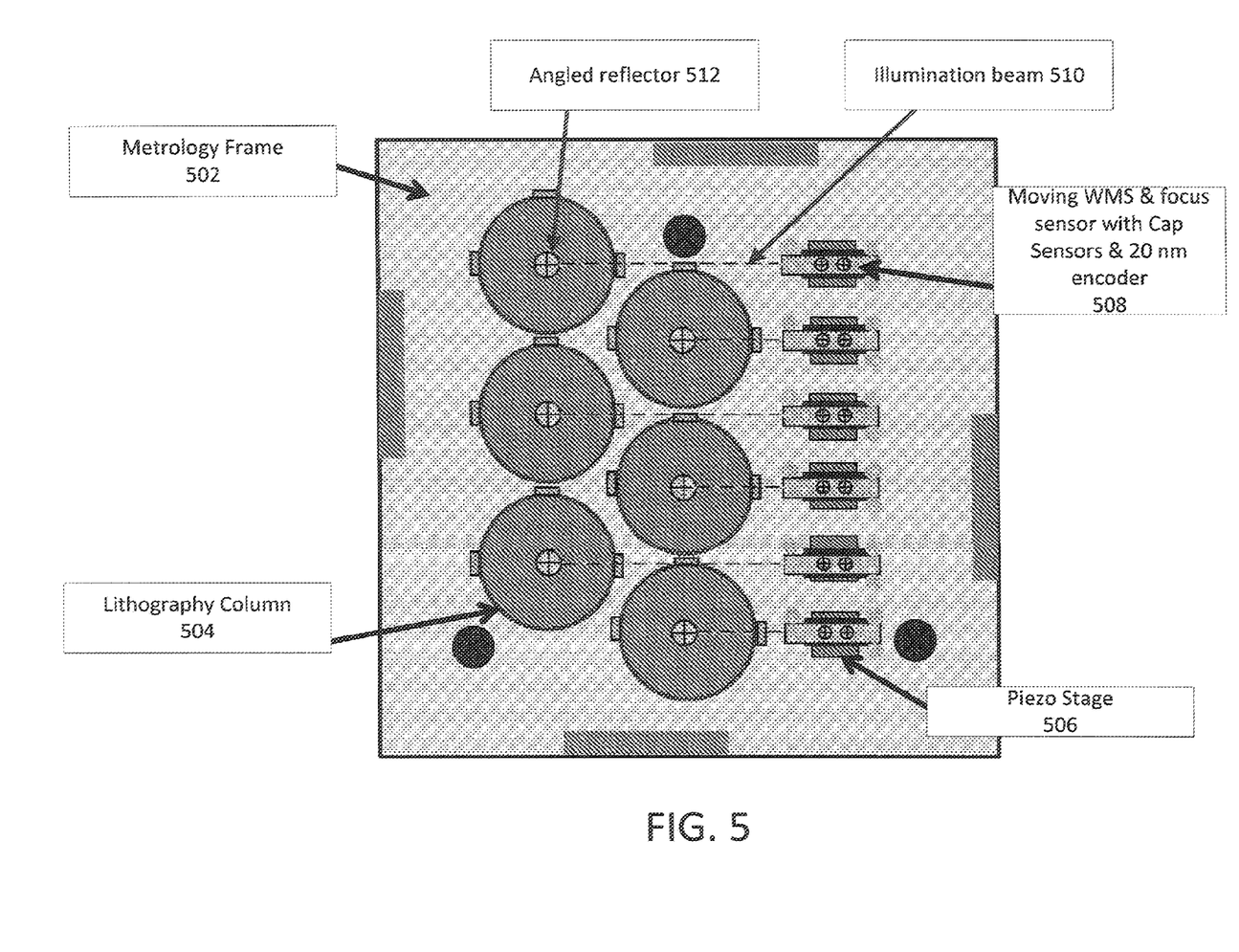
FIG. 5 is a schematic diagram of an arrangement of lithography columns that utilizes the combined alignment and height sensor in accordance with an embodiment of the invention.

FIG. 5 is a schematic diagram of an arrangement of lithography columns 504 that utilizes multiple sensors 508 in accordance with an embodiment of the invention. As depicted, various components may be mounted on a metrology frame 502. The metrology frame 502 may be used to maintain position and alignment of the components.

In one embodiment, the multiple sensors 508 may be used for alignment and so each sensor 508 may include components of the alignment sensor 100 described above. As depicted, an illumination beam 510 (in the plane of the page) from each of sensor 508 may be deflected 90 degrees by an angled reflector 512 (so as to be perpendicular to the plane of the page) to an alignment mark on a semiconductor wafer on which circuitry is being manufactured.

The multiple sensors 508 may be mounted on a movable stage 506. Each stage 506 may move in one-dimension so as to adjust a position of a sensor 508. In particular, the sensors 508 may be moved so as to adjust the pitch between the sensors 508 (in the vertical direction in FIG. 5). In one implementation, the pitch between the sensors 508 may match the die (or "street") pitch on a silicon wafer being manufactured. With the pitches matching, all the sensors 508 may read alignment marks at a same time. This advantageously reduces an overall measurement time.

Because the position of the alignment sensors must be precisely known in all axes, capacitive or interferometric sensors may be used to accurately measure the position of each sensor 508. The sensor position measurements may include measurements in the x, y, and z axes and of tip and tilt, as may be needed.

While FIG. 5 shows one linear array of sensors 508 in a first dimension that matches the pitch of the lithography columns 504 in that first dimension, another embodiment of the invention may have a second linear array of sensors 508 in a second (perpendicular) dimension that matches the pitch of the lithography columns 504 in that second dimension.

What is claimed is:

1. A device that senses alignment and height of a work piece, the device comprising:
    an alignment sensor that generates a first illumination beam that forms a first illumination spot having a long axis of illumination and a short axis of illumination which illuminates an alignment mark on the work piece so as to create a first reflected beam, and detects the first reflected beam using a detector that generates a signal indicating alignment of the first illumination beam relative to the alignment mark, wherein the alignment sensor includes a mechanism for controllably rotating the first illumination spot by ninety degrees; and
    a height sensor that generates a second illumination beam that is directed to a surface of the work piece at an oblique angle so as to form a second illumination spot and uses a detector that locates a center of the second illumination spot to determine the height of the work piece.

2. The device of claim 1, wherein the alignment sensor and the height sensor have a same optical axis.

3. The device of claim 1, wherein the alignment mark on the work piece comprises a long dimension and a short dimension, and wherein the first illumination spot is rotated using the mechanism so that the long axis of illumination is parallel to the long dimension of the alignment mark and the short axis of illumination is parallel to the short dimension of the alignment mark.

4. The device of claim 3, wherein the shape of the first illumination spot is one of a group of shapes consisting of an ellipse and a rectangle.

5. The device of claim 3, wherein the alignment sensor comprises a cylindrical lens that shapes the first illumination beam so as to form the shape of the first illumination spot, and wherein the mechanism rotates the cylindrical lens.

6. The device of claim 3, wherein the alignment sensor comprises an illumination aperture in an image plane that shapes the first illumination beam so as to form the shape of the first illumination spot, and wherein the mechanism rotates the illumination aperture.

7. The device of claim 3, wherein the alignment sensor comprises an illumination source that is shaped so as to form the shape of the first illumination spot, and wherein the mechanism rotates the illumination source.

8. The device of claim 1, wherein the height sensor generates a derivative signal of the second illumination spot.

9. The device of claim 8, wherein the height sensor applies a threshold to the derivative signal to construct a spot outline and finds a center of the spot outline to determine a center of the second illumination spot.

10. The device of claim 1 further comprising:
    a polarizing filter that polarizes the second illumination beam.

11. A method of determining an alignment and height of a work piece, the method comprising:
    generating a first illumination beam using a first illumination source;
    shaping the first illumination beam using an illumination lens to form a first illumination spot on the work piece, the first illumination spot having a shape comprising a long axis of illumination and a short axis of illumination;
    rotating the first illumination spot by rotating an optical element so that the long axis of illumination is parallel to a long dimension of a rectangular alignment mark on the work piece and the short axis of illumination that is parallel to a short dimension of the rectangular alignment mark;
    obtaining a first reflected beam from the first illumination spot using an objective lens;
    determining the alignment using the first reflected beam by diffracting the first reflected beam using a grating to generate a diffracted beam and detecting the diffracted beam using a first detector so as to determine the alignment;
    generating a second illumination beam using a second illumination source that is directed to a surface of the work piece at an oblique angle such that a second illumination spot is formed on the surface of the work piece; and
    imaging the second illumination spot using a second detector so as to determine a height of the surface.

12. The method of claim 11 further comprising:
    generating a derivative signal of the second illumination spot;
    applying a threshold to the derivative signal to construct a spot outline; and
    locating a center of the spot outline to determine a center of the second illumination spot.

\* \* \* \* \*